United States Patent
Alok et al.

(12) 
(10) Patent No.: US 6,559,068 B2
(45) Date of Patent: May 6, 2003

(54) METHOD FOR IMPROVING INVERSION LAYER MOBILITY IN A SILICON CARBIDE METAL-OXIDE SEMICONDUCTOR FIELD-EFFECT TRANSISTOR

(75) Inventors: Dev Alok, Danbury, CT (US); Emil Arnold, Chappaqua, NY (US); Richard Egloff, Yorktown Heights, NY (US); Satyendranath Mukherjee, Yorktown Heights, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/894,089

(22) Filed: Jun. 28, 2001

(65) Prior Publication Data

US 2003/0008442 A1 Jan. 9, 2003

(51) Int. Cl.$^7$ .............................................. H01L 21/469
(52) U.S. Cl. ..................... 438/770; 438/769; 438/771
(58) Field of Search ................................ 438/197, 767, 438/769, 770–774

(56) References Cited

U.S. PATENT DOCUMENTS

| 4,664,946 A | * | 5/1987 | Enomoto et al. | ........ 427/126.2 |
| 5,972,801 A | * | 10/1999 | Lipkin et al. | ................ 438/770 |
| 6,136,727 A | * | 10/2000 | Ueno | .......................... 438/770 |

* cited by examiner

Primary Examiner—David Nelms
Assistant Examiner—Dung Ang Le
(74) Attorney, Agent, or Firm—Aaron Waxler

(57) ABSTRACT

A method for improving inversion layer mobility in a silicon carbide metal-oxide semiconductor field-effect transistor (MOSFET) is provided. Specifically, the present invention provides a method for applying an oxide layer to a silicon carbide substrate so that the oxide-substrate interface of the resulting SiC MOSFET is improved. The method includes forming the oxide layer in the presence of metallic impurities.

27 Claims, 3 Drawing Sheets

METHOD FOR IMPROVING INVERSION LAYER MOBILITY IN A SILICON CARBIDE METAL-OXIDE SEMICONDUCTOR FIELD-EFFECT TRANSISTOR

BACKGROUND OF THE INVENTION

1. Technical Field

The present invention generally relates to a method for improving inversion layer mobility in a silicon carbide (SiC) metal-oxide semiconductor field-effect transistor (MOSFET). In particular, the present invention relates to forming a gate oxide on SiC substrate in the presence of metallic impurities to yield a MOSFET with improved inversion layer mobility.

2. Background Art

Silicon (Si) is, and has been, the most popular and widely used semiconductor material for the past thirty years. During this time, Si device technology has reached an advanced level because of constant refinements and improvements. The result of this constant improvement has brought silicon power devices to such levels of efficiency that they are now approaching the theoretical maximum power limit predicted for this material. This means that further refinements in device design and processing are not likely to yield substantial improvements in performance. However, this state of affairs is not acceptable for a variety of current or future applications where silicon power-devices function with heavy operating losses. To allay this situation, materials scientists have been considering various wide bandgap semiconductors as replacements for silicon.

Silicon Carbide (SiC) is an ideal semiconductor material for high voltage, high frequency and high temperature applications. This is primarily due to the large critical electric field (10 times higher than that of Si), large bandgap (3 times that of Si), large thermal conductivity (4 times that of Si), and large electron saturation velocity (twice that of Si) of SiC. These properties make SiC an ideal replacement of Si for making devices such as MOSFETs. SiC n-channel enhancement mode MOSFETs (herein referred to as SiC MOSFETs) are ideal for applications operating at high voltage, high speed and high frequency.

However, SiC MOSFETs currently fabricated by researchers have shown very poor inversion layer mobility (~1 $cm^2/Vs$), which is one hundred times lower than the expected mobility value. This results in large power dissipation and loss of efficiency, which makes SiC MOSFETs less attractive in comparison to their Si counterparts. The lower inversion layer mobility is primarily due to the poor interface between the gate oxide and the silicon carbide substrate through which the current conduction occurs. Specifically, the interface between the gate oxide and SiC substrate has a large number of interface traps that capture the electrons which otherwise would have aided the current flow.

In view of the foregoing, a need exists for a method for improving inversion layer mobility in SiC MOSFETs. In particular, a method is needed in which an improved interface between a gate oxide layer and a silicon carbide substrate is achieved.

SUMMARY OF THE INVENTION

The present invention overcomes the drawbacks of existing SiC MOSFETs by providing a method for improving inversion layer mobility. In particular, the present invention provides a method for forming a gate oxide layer on a MOSFET such that inversion layer mobility is maximized. Generally, the method includes forming a gate oxide in the presence of metal impurities so that the oxide-substrate interface is improved.

According to a first aspect of the present invention, a method for improving inversion layer mobility in a silicon carbide metal-oxide semiconductor field-effect transistor (MOSFET) is provided. The method comprises the steps of: (1) providing a silicon carbide substrate; and (2) forming an oxide layer on a surface of the silicon carbide substrate in a presence of metallic impurities.

According to a second aspect of the present invention, a method for improving inversion layer mobility in a silicon carbide metal-oxide semiconductor field-effect transistor (MOSFET) is provided. The method comprises the steps of: (1) positioning a silicon carbide substrate and metallic impurities in a chamber; and (2) forming an oxide layer on a surface of the silicon carbide substrate by introducing nitrogen gas bubbled through deionized water into the chamber.

According to a third aspect of the present invention, a method for improving inversion layer mobility in a silicon carbide metal-oxide semiconductor field-effect transistor (MOSFET) is provided. The method comprises the steps of: (1) positioning a silicon carbide substrate and metallic impurities in a chamber; and (2) forming an oxide layer on a surface of the silicon carbide substrate by introducing a gaseous mixture of hydrogen and oxygen into the chamber.

According to a fourth aspect of the present invention, a method for improving inversion layer mobility in a silicon carbide metal-oxide semiconductor field-effect transistor (MOSFET) is provided. The method comprises the steps of: (1) providing a silicon carbide substrate and metallic impurities in a chamber heated to a temperature of approximately 1100° C.; (2) depositing approximately 100-800 nm of a low-temperature oxide on a surface of the silicon carbide substrate; (3) introducing a gaseous mixture of hydrogen and oxygen into the chamber after the depositing step; and (4) annealing the silicon carbide substrate in argon at a temperature of approximately 950° C.

Therefore, the present invention provides a method for improving inversion layer mobility in a MOSFET. Specifically, the present invention forms an oxide layer on a SiC substrate in the presence of metallic impurities to improve the oxide-substrate interface.

BRIEF DESCRIPTION OF THE DRAWINGS

These and other features and advantages of this invention will be more readily understood from the following detailed description of the various aspects of the invention taken in conjunction with the accompanying drawings in which.

Figure 1:
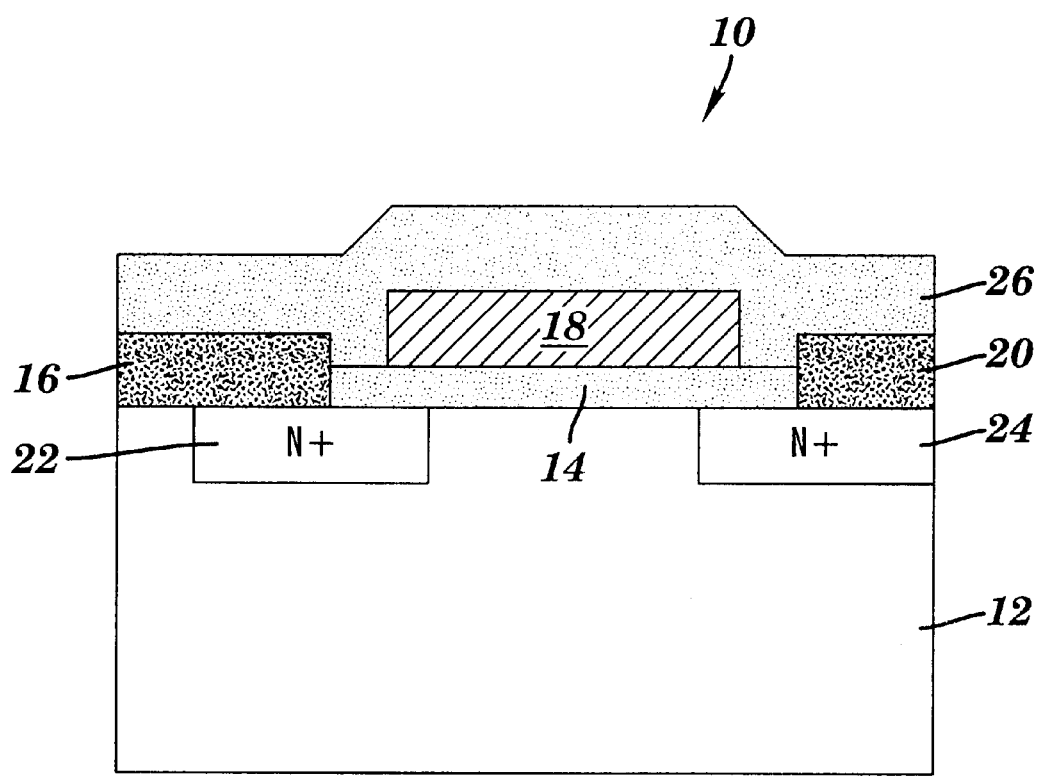
FIG. 1 depicts an enhancement mode NMOS silicon carbide MOSFET according to the present invention.

It is noted that the drawings of the invention are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE DRAWINGS

Referring now to FIG. 1, an enhancement type NMOS device 10 is depicted. NMOS 10 generally comprises SiC p-type doped substrate 12, oxide layer 14 (sometimes referred to as gate oxide), source contact 16, gate contact 18, drain contact 20, n+doped source region 22, n+doped drain region 24, and passivation layer 26. As depicted, source contact 16 and drain contact 20 are in electrical contact with source region 22 and drain region 24, respectively. It should be understood that regions 22 and 24, and contacts 16, 18, and 20 can be formed using any means known in the art and are not intended to be a limiting feature of this invention. For example, contacts 16, 18, and 20 could be deposited metal (e.g., aluminum). Alternatively, gate contact 18 could be polycrystalline silicon applied using a chemical vapor deposition (CVD) process. In the case of the latter, an additional oxide layer could also be provided, via CVD, over the top and side surfaces of gate contact 18.

As discussed above, SiC MOSFETs such as device 10, often exhibit poor inversion layer mobility. Inversion layer mobility refers to the mobility of electrons from source region 22 to drain region 24. The present invention improves the interface between oxide layer 14 and substrate 12 by forming oxide layer 14 in the presence of metallic impurities. The result is a significant improvement in inversion layer mobility, as will be further illustrated below in conjunction with Table I and FIG. 2.

In a first embodiment, oxide layer 14 is grown on SiC substrate 12. In general, the growth of oxide layer 14 involves heating SiC substrate 12 in a chamber (e.g., a furnace) to the desired temperature. Once heated, a gaseous mixture of hydrogen ($H_2$) and oxygen ($O_2$) (i.e., an oxidizing ambient) are introduced into the chamber. In the chamber, the gaseous mixture forms pyrogenic steam, which oxidizes the top surface of SiC substrate 12 to form gate oxide 14. This is known as wet oxidation. Alternatively, another form of wet oxidation can be performed by introducing nitrogen ($N_2$) or oxygen ($O_2$) bubbled through hot deionized water into the heated furnace. Similar to the gaseous mixture of hydrogen and oxygen, the nitrogen saturated with water vapor oxidizes the top surface of SiC substrate 12 to form gate oxide 14.

Under the present invention, the oxidation process occurs in the presence of metallic impurities. Preferably, the metallic impurities are introduced by placing a piece of sintered alumina ($Al_2O_3$) containing iron impurities into the chamber containing the SiC substrate 12. The piece of sintered alumina should contain iron impurities in a concentration sufficient to introduce $4 \times 10^{12}$ $cm^{-2}$ iron atoms into the oxide. It should be understood that although iron impurities are preferred, other like metallic impurities could be utilized. For example, iron (Fe), chromium (Cr), or nickel (Ni) impurities could be introduced. Moreover, it should be understood that the metallic impurities could be introduced prior to, or during the formation of oxide layer 14. For example, the metallic impurities could be delivered in a gaseous form concurrently with the oxidation gas.

Once the oxidation process is complete, the resulting structure is then optionally annealed in an inert gas such as argon. Once annealing is complete, the wet oxidation and annealing steps could be optionally repeated at lower furnace temperatures. The metallic impurity and oxidation gas (i.e., the oxidizing ambient) collectively act as a special oxidizing ambient (SOA), which drastically improves the interface between oxide layer 14 and SiC substrate 12.

In an alternative embodiment, oxide layer 14 is deposited on SiC substrate 12 the presence of metallic impurities and then optionally annealed. Deposition of oxide layer 14 occurs by first depositing a layer of low-temperature oxide (LTO) on a bare surface of SiC substrate 12. Preferably, the layer of LTO is formed by decomposing silane ($SiH_4$) gas in the chamber at 400° C. Once the LTO layer has been deposited, the resulting structure is subjected to the wet oxidation and annealing steps described above. Specifically, the wet oxidation could be performed by introducing an oxidizing ambient of either a hydrogen-oxygen gaseous mixture or nitrogen bubbled through deionized water. In either case, the oxidation process is performed, in the presence of the above-described metallic impurity (e.g., iron, chromium, or nickel). Once oxidation is complete, the oxidized substrate is optionally annealed in an inert gas such as argon. Then, the wet oxidation and annealing steps could be repeated.

EXAMPLE

The effects of the metallic impurities of the present invention were studied on 4H-SiC lateral enhancement typed NMOS devices in which gate oxides (i.e., oxide layer 14) were prepared in two different ways. The first type of gate oxide was grown on a bare silicon carbide (substrate 12) surface in a single wet oxidation-anneal process using the following procedure:

A silicon carbide substrate was placed in a furnace, which was ramped from approximately 800° C. to approximately 1100° C. in an inert gas atmosphere. At approximately 1100° C., the oxidation process was started by introducing a gaseous mixture of hydrogen and oxygen. In another experiment, the wet oxidation was performed by introducing nitrogen bubbled through deionized water kept at approximately 95° C. Metallic impurities were introduced by placing a piece of sintered alumina containing iron impurities into the chamber. The sintered alumina contained a concentration of iron sufficient to introduce approximately $4 \times 10^{12}$ $cm^{-2}$ iron atoms into the oxide gas.

After four hundred minutes of wet oxidation, a sixty minute anneal was initiated by changing the ambient gas to argon. The temperature in the furnace was then ramped down to approximately 950° C. and maintained for sixteen hours. This was followed by a second round of wet oxidation with the oxidation gas used during the original wet oxidation step (i.e., either hydrogen-oxygen, or bubbled through nitrogen) at approximately 950° C. for sixty minutes. Finally, the oxidation gas was changed to argon for approximately sixty minutes, and then the chamber temperature was reduced from approximately 950° C. to approximately 800° C. The resulting structure had an oxide layer thickness of approximately 50 nm.

In another experiment, the gate oxide was deposited instead of grown. Specifically, approximately 100-800 m of a low-temperature-oxide (LTO) was deposited on a surface of the substrate. This layer was deposited by introducing silane gas into the chamber, and decomposing the silane at approximately 400° C. Once the LTO was deposited, a wet oxidation (as described above) was performed. In particular, the chamber was heated to approximately 1100° C., at which point the oxidation process was started by introducing a wet oxidation gas. As indicated above, the oxidation gas could be either a gaseous mixture of hydrogen and oxygen, or nitrogen bubbled through deionized water kept at approximately 95° C. Metallic impurities were introduced by placing a piece of sintered alumina containing iron impurities into the chamber. The sintered alumina contained a concentration of iron sufficient to introduce approximately $4 \times 10^{12}$ $cm^{-2}$ iron atoms into the oxide gas.

After four hundred minutes of wet oxidation, a sixty minute anneal was initiated by changing the ambient gas to argon. The temperature in the furnace was then ramped down to approximately 950° C. and maintained for sixteen hours. This was followed by a second round of wet oxidation with the oxidation gas used during the original wet oxidation step (i.e., either hydrogen-oxygen, or bubbled through nitrogen) at approximately 950° C. for sixty minutes. Finally, the oxidation gas was changed to argon for approximately sixty minutes, and then the chamber temperature was reduced from approximately 950° C. to approximately 800° C. The resulting structure had an oxide layer thickness of approximately 50 nm.

Table I depicts a comparison of average effective inversion layer mobility ($cm^2/Vs$) for lateral SiC MOSFETs prepared in the absence of metallic impurities and in the presence of metallic impurities.

TABLE I

|  | Oxidation-anneal in absence of metallic impurities | Oxidation-anneal in presence of metallic impurities |
|---|---|---|
| Thermally-grown oxide on bare SiC surface | 3 +/− 2 | 123 +/− 38 |
| Deposited oxide plus oxidation-anneal | 4 +/− 3 | 70 +/− 35 |

As can be seen, the SiC MOSFETs prepared in the presence of the metallic impurities show significantly greater average effective inversion layer mobility than SiC MOSFETS prepared without metallic impurities. Specifically, SiC MOSFETs with oxide layers thermally grown in the presence of the metallic impurities exhibited an average effective inversion layer mobility of approximately 123 $cm^2/Vs$, while SiC MOSFETs prepared in the absence of the metallic impurities exhibited an average effective inversion layer mobility of approximately 3 $cm^2/Vs$. Similarly, SiC MOSFETs with oxide layers deposited in the presence of the metallic impurities exhibited an average effective inversion layer mobility of approximately 70 $cm^2/Vs$, while similar SiC MOSFETs prepared in the absence of the metallic impurities exhibited an average effective inversion layer mobility of approximately 4 $cm^2/Vs$.

Figure 2:
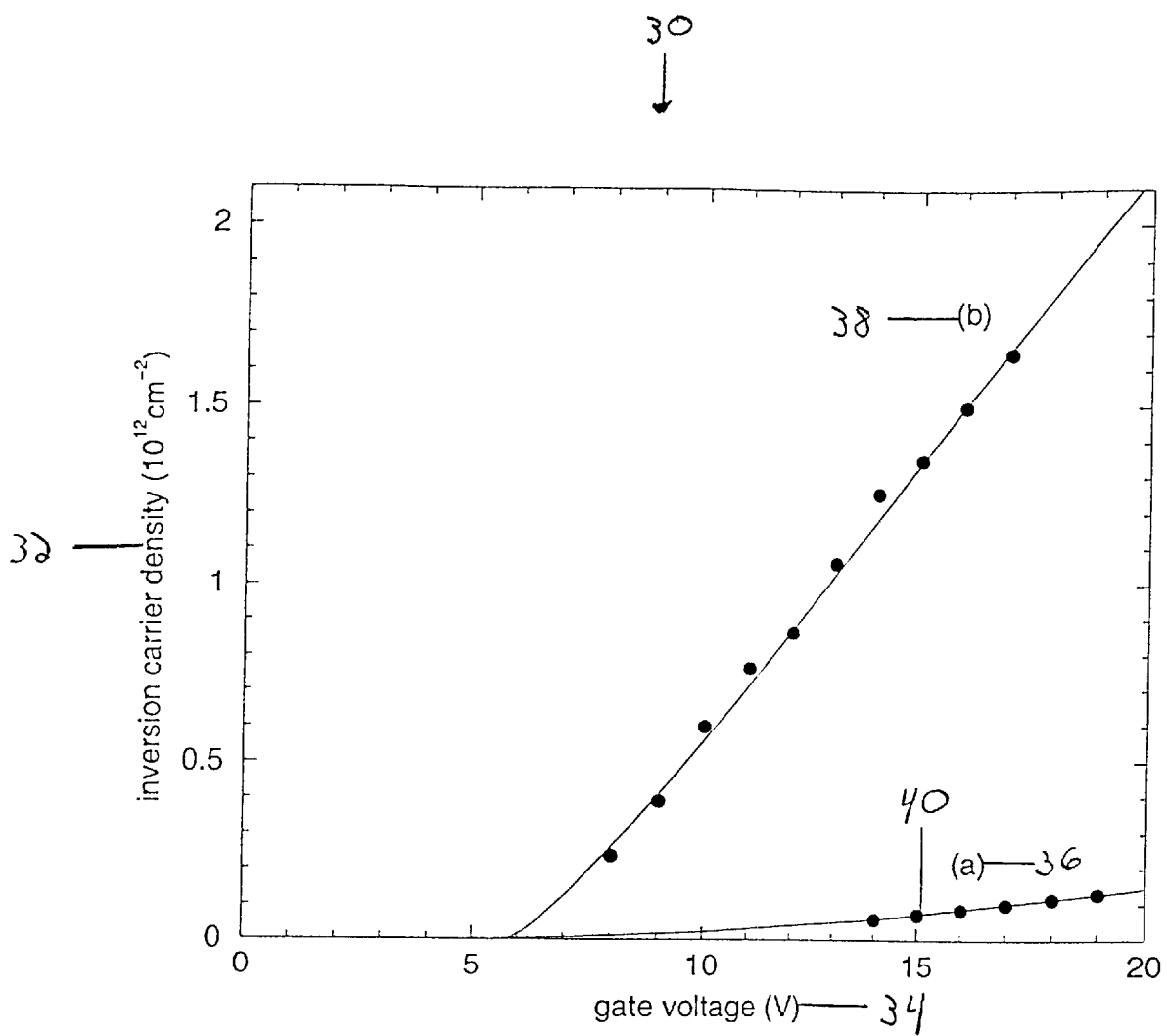
FIG. 2 depicts a graph of inversion carrier density versus gate voltage.

FIG. 2 shows a graph 30 of inversion carrier density ($10^{12}$ $cm^{-2}$) 32 versus gate voltage (V) 34. Specifically, graph 30 depicts the mobility of electrons from source to drain. Curve 36 depicts inversion carrier density for a SiC MOSFET prepared without the presence of metallic impurities. Conversely, curve 38 depicts a SiC MOSFET prepared as described in the above example (i.e., with metallic impurities). As can be seen, when forming an oxide layer in the presence of metallic impurities, the resulting inversion carrier density is drastically improved. Specifically, referring to point 40, it can be seen that at a gate voltage of approximately 1.5 Volts, the inversion carrier density for the SiC MOSFET prepared without introducing metallic impurities (curve 36) is approximately 0.1 $10^{12}$ $cm^{-2}$. In contrast, the SiC MOSFET prepared according to the teachings of the present invention (curve 38) has an inversion carrier density of approximately 1.35 $10^{12}$ $cm^{-2}$. Thus, graph 30 shows that the effects of trapping are significantly reduced in SiC MOSFETs prepared in accordance with the present invention.

Although the method(s) of the present invention are preferably utilized for an enhancement mode NMOS device, such as that shown in FIG. 1, it should be understood that the method(s) could be applied to any enhancement or depletion mode NMOS or PMOS device.

Figure 3:
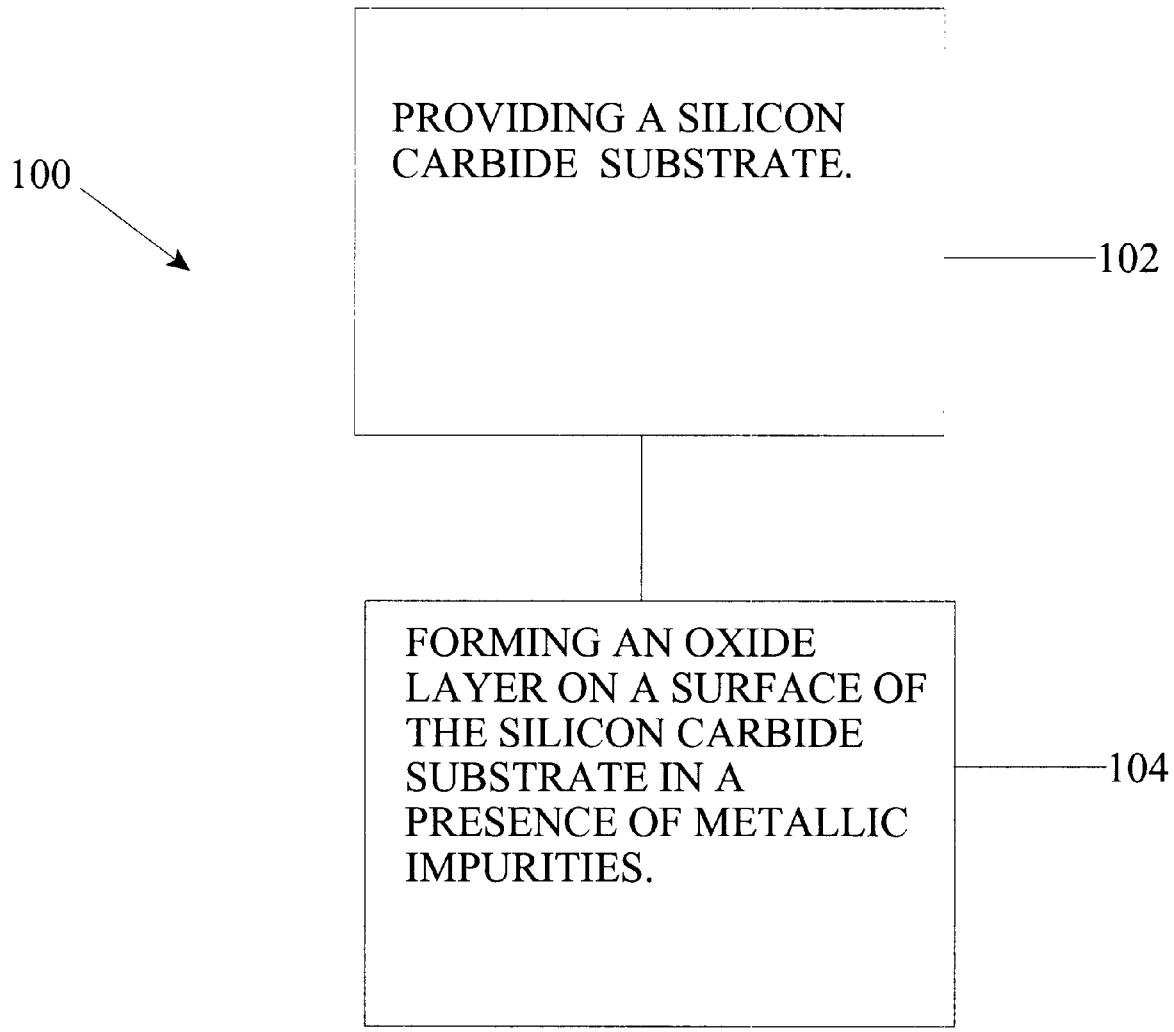
FIG. 3 depicts flow chart of a method according to the present invention.

Referring now to FIG. 3, a flow chart of a method 100 according to the present invention is shown. As depicted, first step 102 of method 100 is to provide a silicon carbide substrate and metallic impurities. Second step 104 is to form an oxide layer on a surface of the silicon carbide substrate in a presence of the metallic impurities.

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed is:

1. A method for improving inversion layer mobility in a silicon carbide metal-oxide semiconductor field-effect transistor (MOSFET), comprising the steps of:

providing a silicon carbide substrate; and forming an oxide layer on a surface of the silicon carbide substrate by introducing a source of metallic impurities into a chamber.

2. The method of claim 1, further comprising the step of annealing the substrate in argon after the forming step.

3. The method of claim 2, further comprising the step of repeating the forming and annealing steps.

4. The method of claim 1, wherein the oxide layer is formed by introducing a mixture of hydrogen and oxygen into a chamber containing the silicon carbide substrate.

5. The method of claim 1, wherein the oxide layer is formed by introducing nitrogen gas bubbled through de-ionized water into a chamber containing the silicon carbide substrate.

6. The method of claim 1, wherein the oxide layer is formed by:

depositing approximately 100-800 nm of a low-temperature-oxide on a surface of the silicon carbide substrate; and introducing a mixture of hydrogen and oxygen into a chamber containing the silicon carbide substrate.

7. The method of claim 1, wherein the oxide layer is formed by:

depositing approximately 100-800 nm of low-temperature-oxide on a surface of the silicon carbide substrate; and introducing nitrogen gas bubbled through de-ionized water into a chamber containing the silicon carbide substrate.

8. The method of claim 1, further comprising the step of providing metallic impurities prior to the forming step.

9. The method of claim 1, further comprising the step of providing metallic impurities during to the forming step.

10. The method of claim 1, wherein the metallic impurities comprise sintered alumina containing at least approximately $4 \times 10^{12}$ $cm^{-2}$ iron atoms.

11. The method of claim 1, wherein metallic impurities are selected from the group consisting of chromium, iron, and nickel.

12. A method for improving inversion layer mobility in a silicon carbide metal-oxide semiconductor field-effect transistor (MOSFET), comprising the steps of: position a silicon carbide substrate and introducing a source of metallic impurities and forming an oxide layer on a surface of the silicon carbide substrate by introducing nitrogen gas bubbled through deionized water into the chamber.

13. The method of claim 12, further comprising the step of annealing the silicon carbide substrate in argon after the forming step.

14. The method of claim 13, further comprising the steps of:
heating the chamber to a temperature of approximately 1100° C. prior to the forming step;
repeating the forming step at a temperature of approximately 950° C.;
repeating the annealing step at a temperature of approximately 950° C.; and
reducing a temperature of the chamber to approximately 800° C. after the repeated annealing step.

15. The method of claim 14, wherein the first forming step is performed for approximately four hundred minutes, wherein the first annealing step is performed for approximately sixty minutes, wherein the repeated forming step is performed for approximately sixty minutes, and wherein the repeated annealing step is performed for approximately sixty minutes.

16. The method of claim 12, wherein the forming step comprises the steps of:
depositing approximately 100-800 nm of a low-temperature-oxide on a surface of the silicon carbide substrate; and
introducing nitrogen gas bubbled through de-ionized water into the chamber.

17. The method of claim 12, wherein the method produces a silicon carbide substrate having an oxide layer thickness of approximately 50nm.

18. The method of claim 12, wherein the metallic impurities are selected from the group consisting of iron, chromium and nickel.

19. A method for improving inversion layer mobility in a silicon carbide metal-oxide semiconductor field-effect transistor (MOSFET), comprising the steps of: position a silicon carbide substrate and introducing a source of metallic impurities and
forming an oxide layer on a surface of the silicon carbide substrate by introducing a gaseous mixture of hydrogen and oxygen into the chamber.

20. The method of claim 19, further comprising the step of annealing the silicon carbide substrate in argon after the forming step.

21. The method of claim 20, further comprising the steps of:
heating the chamber to a temperature of approximately 1100° C. prior to the forming step;
repeating the forming step at a temperature of approximately 950° C.;
repeating the annealing step at a temperature of approximately 950° C.; and
reducing a temperature of the chamber to approximately 800° C. after the repeated annealing step.

22. The method of claim 21, wherein the first forming step is performed for approximately four hundred minutes, wherein the first annealing step is performed for approximately sixty minutes, wherein the repeated forming step is performed for approximately sixty minutes, and wherein the repeated annealing step is performed for approximately sixty minutes.

23. The method of claim 19, wherein the forming step comprises the steps of:
depositing approximately 100-800 nm of a low-temperature-oxide on a surface of the silicon carbide substrate; and
introducing a gaseous mixture of hydrogen and oxygen into the chamber.

24. The method of claim 19, wherein the method produces a silicon carbide substrate having an oxide layer thickness of approximately 50 nm.

25. The method of claim 19, wherein the metallic impurities are selected from the group consisting of iron, chromium and nickel.

26. A method for improving inversion layer mobility in a silicon carbide metal-oxide semiconductor field-effect transistor (MOSFET), comprising the steps of:
providing a silicon carbide substrate and metallic impurities in a chamber heated to a temperature of approximately 1100° C.;
depositing approximately 100-800 nm of a low-temperature oxide on a surface of the silicon carbide substrate;
introducing a gaseous mixture of hydrogen and oxygen into the chamber after the depositing step; and
annealing the silicon carbide substrate in argon at a temperature of approximately 950° C.

27. The method of claim 26, further comprising the steps of:
repeating the depositing, introducing, and annealing steps at a temperature of approximately 950° C.

* * * * *